United States Patent [19]

Holland et al.

[11] Patent Number: 4,920,076

[45] Date of Patent: Apr. 24, 1990

[54] METHOD FOR ENHANCING GROWTH OF $SIO_2$ IN SI BY THE IMPLANTATION OF GERMANIUM

[75] Inventors: Orin W. Holland, Oak Ridge; Dariush Fathy, Knoxville; Clark W. White, Oak Ridge, all of Tenn.

[73] Assignee: The United States of America as represented by the United States Department of Energy, Washington, D.C.

[21] Appl. No.: 181,899

[22] Filed: Apr. 15, 1988

[51] Int. Cl.$^5$ ............................................. H01L 21/473
[52] U.S. Cl. .................................... 437/238; 437/24; 437/239; 437/240
[58] Field of Search .................. 437/20, 25, 24, 70, 437/247, 240, 238, 239; 148/DIG. 58, DIG. 116, DIG. 117, DIG. 78, DIG. 83

[56] References Cited

U.S. PATENT DOCUMENTS

| | | | |
|---|---|---|---|
| 4,728,619 | 3/1988 | Pfiester et al. | 437/70 |
| 4,743,563 | 5/1988 | Pfiester et al. | 437/70 |
| 4,748,134 | 5/1988 | Holland et al. | 437/70 |

OTHER PUBLICATIONS

Pfiester et al., "Novel Germanium/Boron Channel-Stop Implantation for Submicron CMOS," IEDM, 12/1987, pp. 740–743.
Ghandhi, *VLSI Fabrication Principles*, John Wiley & Sons, Inc., 1983, pp. 377–388.
D. Fathy, C. W. White, and O. W. Holland, Mat. Res. Soc. Symp. Proc. vol. 93, pp. 27–33, 1987.
D. Fathy, C. W. White, and D. W. Holland, SPIE vol. 797, pp. 83–87 (1987).
O. W. Holland, C. W. White, and D. Fathy, Appl. Phys. Lett. 51(7), Aug. 17, 1987, pp. 520–522.
D. Fathy, D. W. Holland, and C. W. White, Appl. Phys. Lett. 51(17), pp. 1337–1339, Oct. 26, 1987.
A. S. Grove, et al. J. Appl. Phys. 35, 2695 (1964).
R. Francis, et al. J. Appl. Phys. 50, 280 (1979).
J. F. Gotzlich et al., "Dopant Dependence of the Oxidation Rate of Ion Implanted Silicon," Radiation Eff. 47, 203–210 (1980).
G. Mezey et al., Ion Implantation in Semiconductors, Plenum Press (1976), p. 49.
J. Bevk et al., "Ge-Si Layered Structures: Artificial Crystals and Complex Cell Ordered Superlattices," Appl. Phys. Lett. 49(5); Aug. 4, 1986, pp. 286–288.
J. C. Bean et al., J. Vac. Sci, Techhol. A 2(2), pp. 436–440, Apr.–Jun. 1986.
N. M. Ravindra, Mat. Lett. vol. 4, No. 8, 9, pp. 337–342.
B. E. Deal, J. Appl. Phys. vol. 36, No. 12, pp. 3770–3778, Dec. 1965.
E. A. Irene; J. Electrochemical Soc., pp. 1613–1616, Dec. 1974.
T. Y. Tan et al., Appl. Phys. Lett. 40(7), Apr. 1, 1982, pp. 616–619.
I. S. Williams, Nuc. Ins. Methods 182/183 (1981) 667–673.

*Primary Examiner*—Brian E. Hearn
*Assistant Examiner*—M. Wilczewski
*Attorney, Agent, or Firm*—David E. Breeden; Stephen D. Hamel; William R. Moser

[57] ABSTRACT

A method for enhancing the conversion of Si to $SiO_2$ in a directional fashion wherein steam or wet oxidation of Si is enhanced by the prior implantation of Ge into the Si. The unique advantages of the Ge impurity include the directional enhancement of oxidation and the reduction in thermal budget, while at the same time, Ge is an electrically inactive impurity.

11 Claims, 7 Drawing Sheets

PROCESS
(1) OXYGEN DIFFUSION THROUGH OXIDE
(2) SILICON DIFFUSION THROUGH Ge
(3) FORMATION OF $SiO_2$ AT THE INTERFACE

Fig.1(a)

WET OXIDATION
(900°C IN STEAM)

IMPLANTED REGION

Fig.1(b)

VIRGIN REGION

Fig.1(c)

PROCESS
 (1) OXYGEN DIFFUSION THROUGH OXIDE
 (2) SILICON DIFFUSION THROUGH Ge
 (3) FORMATION OF SiO₂ AT THE INTERFACE

METHOD FOR ENHANCING GROWTH OF SIO₂ IN SI BY THE IMPLANTATION OF GERMANIUM

BACKGROUND OF THE INVENTION

1. Field of the Invention

The present invention relates to a method and product of the same, wherein the method comprises converting Si to $SiO_2$ in a directional fashion whereby steam or wet oxidation of Si is enhanced by the prior implantation of Ge into the Si. During the oxidation, the Ge is piled-up ahead of the $SiO_2$/Si interface. This segregation of Ge leads to the formation of a distinct, almost pure Ge layer which is epitaxial with the underlying Si. The U.S. Government has rights in this invention pursuant to Contract No. DE-AB01-87GC20109.M000 awarded by the U.S. Department of Energy.

2. Description of Related Art

The fabrication of integrated circuits in Si (silicon) depends critically on the ability of Si to form a thermal oxide. Not only are such oxides used as implantation and diffusion masks, but also to electrically isolate devices and various device components. Thermal oxides also function as the gate dielectric in MOSFET's (metal-oxide-semiconductor field-effect transistors). The importance of thermal oxides in the entire integrated circuit (IC) fabrication process warrants investigation of the basic oxidation mechanism and means to control the process for reproducible growth of thin, high-quality oxides. Thermal oxidation in Si occurs by the diffusion of oxidant (oxidizing specie) through the oxide to the oxide/Si interface where it reacts with Si to form $SiO_2$. Gotzlich et al, "Dopant Dependence ...," *Radiation Effects*, 47, pp. 203–210 (1980). However, this is accomplished slowly and is nondirectional in nature, causing a condition known as "bird beaking" in IC manufacturing. This lateral growth of $SiO_2$ could be limited by enhancing the vertical growth. The enhancement of oxide growth could also reduce the amount of heat and time required for the oxidation step. A selective Ge+ implantation of Si (accomplished by standard lithography techniques) could produce varying thicknesses of oxidation on the same Si wafer. This could be beneficial in forming, using a single oxidation cycle, oxides of different thickness for device and masking applications. A specific masking application which utlizes the differential oxide growth rates is detailed later. It is known that the presence of dopants in the near-surface region of Si can effect oxidation rates. Previous work, i.e. Gotzlich et al, has shown that Group III and V dopants can enhance the rate of oxidation of Si. However, prior-art impurities are electrically active and can have deleterious effects on IC performance when present in the field oxide or in the underlying Si. An electrically-inactive impurity is therefore desirable.

There is evidence that a rough interface between Si and $SiO_2$ can be deleterious to the electrical qualities of the $SiO_2$. If the interface could be made smoother and/or flatter, the quality of the $SiO_2$ properties would be increased. The rough interface appears to be related to strain caused by the volumetric mismatch between the Si and the oxide phase which forms. Accommodation of this mismatch is a suspected cause for the injection of point defects (e.g. interstitials) into the Si substrate during oxidation which leads to extended defects and stacking faults that getter metallic impurities in the Si, creating deleterious pockets of conductivity, or "leaks." If such defects could be reduced, IC reliability would be substantially increased. Thus, a method for enhancing oxide growth on Si is desirable. Also, elmination of point-detect injection during oxidation will eliminate the enhanced diffusion in the underlying Si substrate that many dopants experience as a result of the nonequilibrium defect population.

It is also known that if Ge (germanium) could be epitaxially formed on a Si substrate, several new and useful configurations and methods relating to electronic circuits could result. Ge and Si devices could be built into the same integrated circuit (IC). Devices using both Ge and Si could be manufactured. An epitaxial layer of Ge on Si would have advantages in forming epitaxial GaAs on Si substrates for use in optical coupling circuitry.

Germanium has other advantages for use in semiconductors, one of which is its higher mobility as compared with Si. However, a native oxide layer is not practical with Ge because $GeO_2$ is water soluble and is not structurally stable enough to provide the protection that is purposed by its presence. A stable oxide layer is needed to make Ge semiconductor applications more practical.

Epitaxial Ge can be produced by techniques such as molecular beam epitaxy, *Appl. Phys. Lett.*, 49(5), pp. 286–88 (1986). However, such techniques require elaborate cleaning procedures and ultrahigh vacuum systems.

SUMMARY OF THE INVENTION

It is therefore an object of this invention to provide a process for directionally enhancing the growth of $SiO_2$ on Si in an oxidizing process.

It is also an object of this invention to provide a process to reduce "bird beaking" in electronic microcircuit manufacturing.

It is another object of this invention to provide a process to reduce the heat and time required to produce a layer of $SiO_2$ on Si.

Still a further object of this invention is to provide a process to prepare $SiO_2$ layers of varying thickness on the same Si wafer which could have both device and masking applications.

Still another object of this invention is to provide a process for forming $SiO_2$ on Si substrates whereby the $SiO_2$/Si interface is smooth.

Still a further object of this invention is to provide a process for forming $SiO_2$ on Si substrates whereby the interfacial strain at the Si/$SiO_2$ boundary is reduced, thus reducing strain-related defects in the Si substrate and the associated enhanced diffusion of dopants.

It is yet another object of this invention to provide an electrically inactive impurity for enhancing Si oxidation.

It is still a further object of this invention to provide a process for forming epitaxial Ge on Si substrates.

It is still another object of this invention to provide a process for manufacturing Ge and Si devices on the same substrate.

It is yet a further object of this invention to provide a process for forming atomically matched GaAs on Si substrates.

Still yet another object of this invention is to provide a process for manufacturing devices of a combination of Ge, Si and GaAs.

Still yet a further object of this invention is to provide a process for producing epitaxial Ge on Si substrates without the need for elaborate cleaning procedures or ultrahigh vacuum systems.

The foregoing objects and others are accomplished in accordance with the present invention, generally speaking, by providing a process to directionally enhance the oxidation of silicon which includes the steps of (1) enriching the surface of a silicon wafer or substrate with germanium so as to form epitaxial germanium thereon; and (2) oxidizing the silicon wafer in an atmosphere containing H$_2$O at a temperature of from 700° to 1200° C. While implantation is the preferred method of enriching the Si with Ge in this embodiment, other techniques such as diffusion or introduction during growth would be equally effective in forming epitaxially layers during subsequent oxidation. However, those benefits which depend on the directionality of the implantation process would be lost.

The present invention is also generally described as encompassing a silicon wafer having on its surface or a portion thereof an epitaxial layer of germanium formed by the above process and an electronics component which comprises a silicon wafer having an oxidized surface layer with a smooth interface, wherein the oxidized surface layer is formed by the above process, and the oxidized surface layer is characterized by an essentially unidirectional formation.

BRIEF DESCRIPTION OF THE DRAWINGS

The present invention will become more fully understood from the detailed description given hereinbelow and the accompanying drawings which are exempletive only, and thus are not limitative to the present invention, and wherein.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF INVENTION

Figures 1A, 1B, 1C:
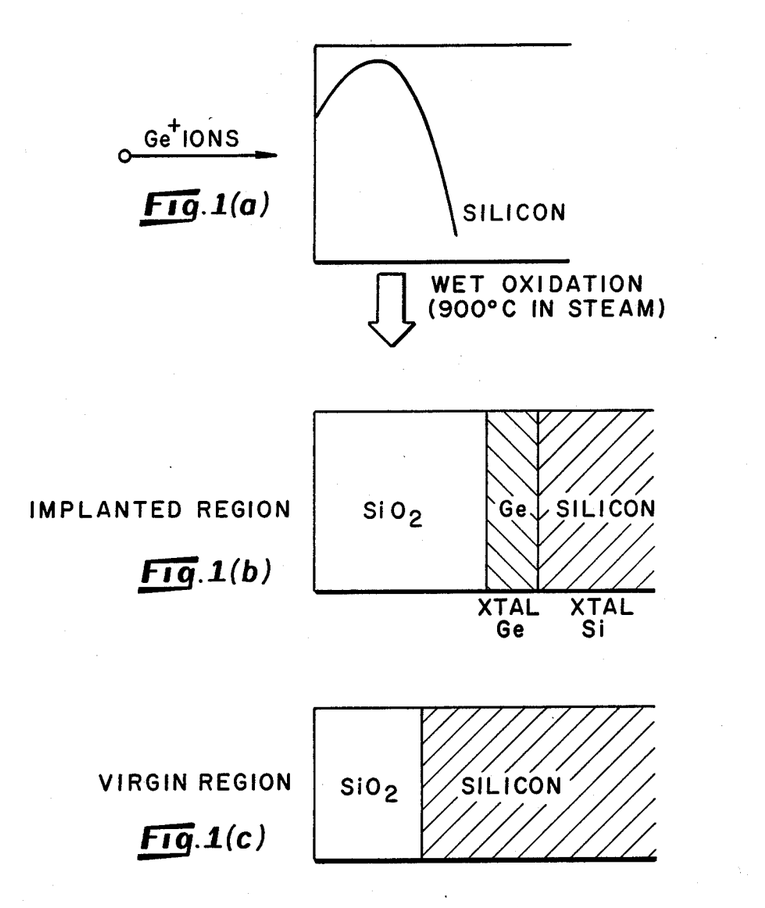
FIGS. 1(a), 1(b), and 1(c) are schematics showing the oxidation of Ge+ implanted Si and virgin Si.

The process of the present invention increases substantially the steam oxidation rate of Si by including the implantation of Ge prior to oxidation. This effect is most pronounced for thin oxides. During steam oxidation, the implanted Ge is completely rejected from the growing oxide and forms an intermediate layer between Si and SiO$_2$ as illustrated by FIGS. 1(a)-1(c). Segregated Ge is epitaxial with the underlying Si and increases the interface kinetics associated with oxide formation as indicated by the discussion below.

The kinetics of the oxidation of Si can be expressed by the equation $$x^2 + Ax = B(t + t_i),$$

wherein x is the oxide thickness, t is the oxidation time, and A and B are constant for a given set of oxidation conditions. A is the diffusion rate of oxygen through the SiO$_2$ and B is the interfacial O—Si reaction rate. The quantity $t_i = (x_i^2 + Ax_i)/B$ is related to the initial conditions, wherein $x_i$ is the thickness of a pre-existing oxide. Two different regimes of growth are generally identified: a linear regime when $t << A^2/4B$ which leads to the relation $x = B/A(t + t_i)$ and a parabolic regime when $t >> A^2/4B$ which gives $x^2 = Bt$. In the linear regime, the oxide growth is limited by the SiO$_2$/Si interface kinetics while in the parabolic regime, the growth rate is controlled by the diffusion of oxidant through the oxide. The activation energy of B, the diffusion rate constant, is similar to that for diffusion of oxygen and water in fused silica for dry and wet oxidations respectively, while the interfacial rate constant B/A is the same for wet and dry conditions and has an activation energy similar to the energy required to break a Si—Si bond.

Figure 2:
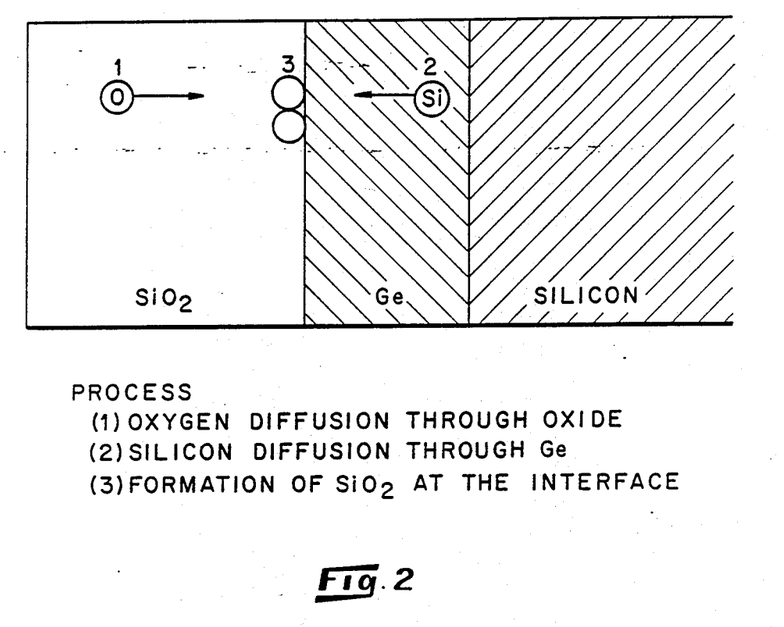
FIG. 2 is a schematic of the oxidation model of Ge+ implanted Si.

The presence of a Ge layer between the oxide and Si during oxidation offers a substantially different morphology from that which normally forms during thermal oxidation of Si. While it is still assumed that oxidant diffuses through the oxide to react with Si at the oxide boundary, Si must be supplied to this interface by transport across the Ge/Si interface and through the Ge layer as illustrated by FIG. 2. However, neither of these additional steps is thought to be rate limiting simply because oxidation rates are enhanced, not retarded, by the presence of this layer. This is consistent with the rapid diffusion of Si in Ge at the oxidation temperature which is near the melting point of Ge. Also, since all of the Ge is rejected from the oxide, it is assumed that the intrinsic properties of the oxide formed do not differ from those grown without the implantation. Therefore, the oxidation mode given in the above equation is considered valid in the present case but with a modified constant A to account for the different kinetics at the growth interface.

Generally, the process of the present invention includes the steps of (1) enriching the surface of a Si wafer with Ge to form an epitaxial layer; and (2) oxidizing the Si wafer in an atmosphere containing H$_2$O under certain conditions.

The Si wafer used in the process of the present invention may be formed from appropriate Si crystals, such as, for example, single crystals of n-type Si with a (100) orientation and resistivities in the range of 1-15 ohm-cm. The Ge useful in the present invention includes, for example, singly charged Ge ions, such as, for example, singly charged $^{74}Ge^+$ ions.

The conditions for the implantation of Ge in Si in accordance with the present invention include, for example, the use of an average current density of less than 10 uamps/cm$^2$. The implantation dose used to form the Ge layer may be equal to several monolayers or more, and is preferably one monolayer if effective enhancement of oxidation rates is desired.

The oxidation conditions of the process of the present invention include an atmosphere containing H$_2$O, such as, for example, an atmosphere containing steam, and a temperature ranging from about 700° to about 1200° C., preferably in the middle of this range, such as, for example, about 900° C. to 1000° C.

PREFERRED EMBODIMENTS

EXAMPLE 1

Crystals of n-type Si with a (100) orientation and resistivities in the range of 1–15 ohm-cm were used as a silicon body on which Ge implantation was performed using singly charged $^{74}Ge^+$ ions and an average current density of less that 10 uamps/cm$^2$. An area on each sample was masked during implantation in order to provide a virgin area on the samples.

Oxidations of the Ge doped Si were done at 900° C. in a tube furnace by passing steam over the specimens. The thickness of the oxides and the profile of the implanted Ge were determined with Rutherford backscattering spectroscopy. Oxide thicknesses were then measured on implanted and non-implanted regions on the same sample to ensure a valid comparison.

Figure 3:
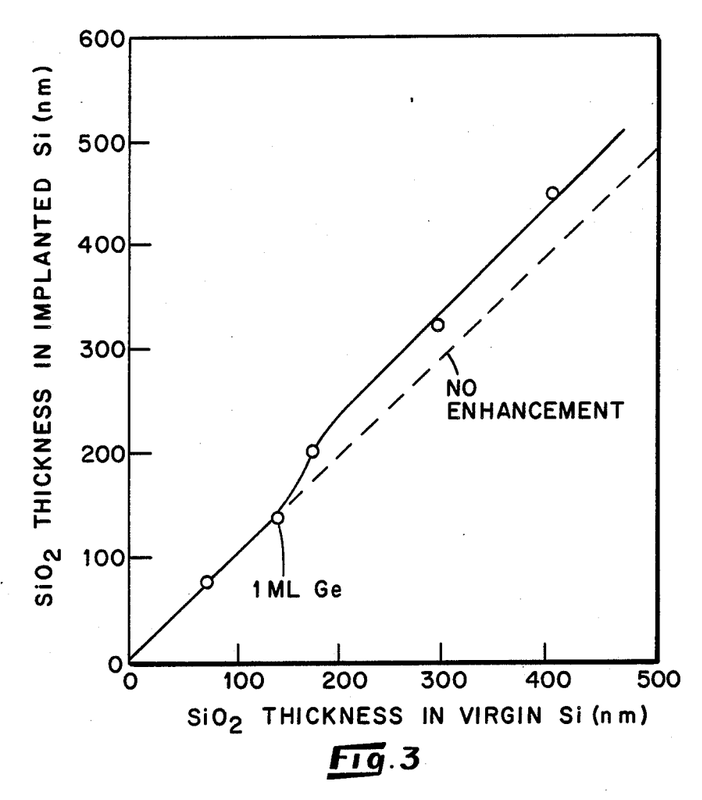
FIG. 3 is a graph showing the thickness of thermal oxides grown at 900° C. in steam on virgin Si compared to $^{74}$Ge (160 keV, $\times 10^{16}$ cm$^{-2}$) implanted Si.

The influence of the Ge layer on the oxidation rate is shown in FIG. 3 which compares the thickness of oxides grown for various times in implanted and nonimplanted Si. In the implanted samples, an energy of 160 keV and fluence of $1 \times 10^{16}$ Ge$^+$/cm$^2$ was used. A line corresponding to no enhancement (i.e., one-to-one ratio) is shown in the figure for reference. It is seen that there is no growth enhancement for oxide thicknesses up to 140 nm. However, between 140–250 nm, the growth in the implanted samples is enhanced. The thickness of 140 nm corresponds to the depth at which approximately 1 monolayer (ML) of Ge is piled-up by the oxide. This was calculated using the implanted Ge profile and given that 0.46 nm of Si is consumed for every 1 nm of oxide formed. This suggests that 1 ML of Ge at the interface is necessary to effect oxidation rates. Beyond 250 nm the enhancement stops accelerating and the data parallels the reference line, displaced by an amount corresponding to the earlier enhanced growth. Therefore, growth rates are influenced most during the earlier stages of oxidation but not until a "critical" amount of Ge is piled-up. This supports the assumption that the effect is a result of a modified interfacial reaction and discounts the contributions of other possible mechanisms, such as implant damage to the effect.

In a conventional analysis, x versus t/x is plotted and, B and A determined. This was done using the data for the thicker oxides after all of the Ge had piled-up and growth had become diffusion limited to show that B, the diffusion rate constant, is not affected by implantation. This justifies the assumption that the intrinsic properties of the oxides formed in this manner are not different from "normal" thermal oxides. However, such an analysis (which assumes A and B to constant) is not easily done to determine A which is not constant throughout the oxidation cycle but decreases in some manner when Ge is present at the interface. Since the effect shows such a marked increase when a ML is segregated, it suggests that this "critical" amount corresponds to the minimum thickness needed before the film's properties (mechanical, chemical, and electrical) become distinct from the substrate. If this is the case, it is reasonable to assume that the addition of more layers will not have a large effect. Therefore, the influence of Ge on the interfacial reaction rate is modeled as a critical phenomena which occurs rapidly over a very narrow parametric range and either saturates or becomes slowly varying. For calculation purposes, it can be represented by a simple step-function.

Figure 4:
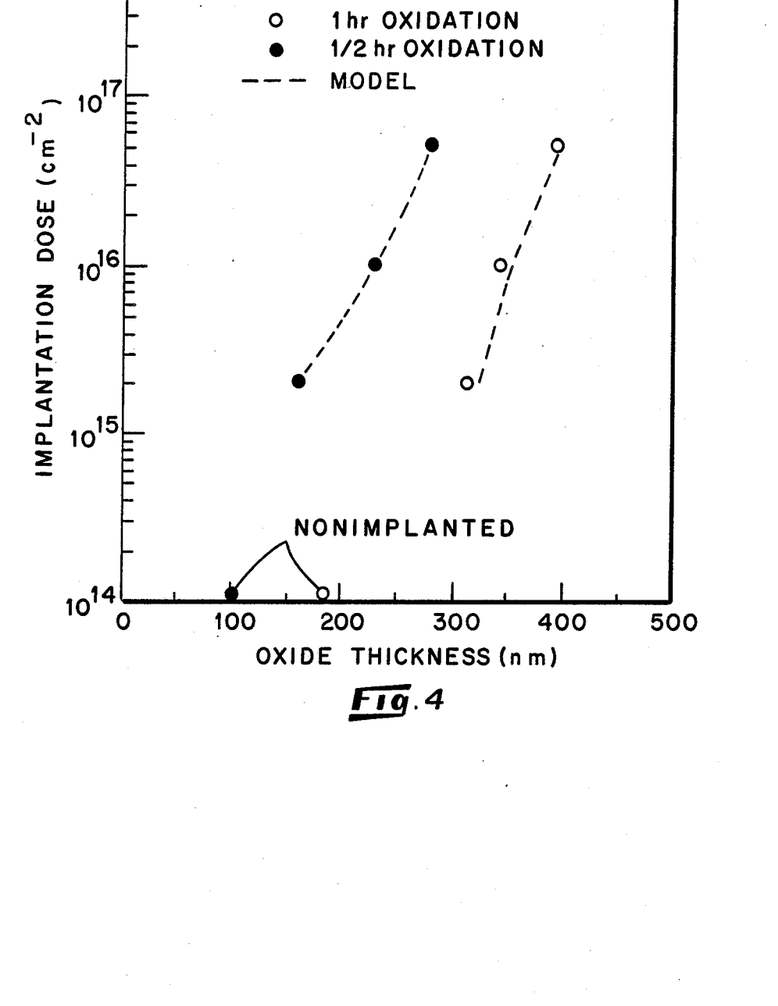
FIG. 4 is a graph showing implantation dose versus oxide thickness in Si implanted with 50 keV Ge+ ions and steam oxidized at 900° C.

To test this hypothesis, the effect of implantation dose on oxide growth was determined and compared to the model predictions. FIG. 4 shows the results of oxidation of Si implanted with different doses of Ge$^+$ ions at 50 7eV. It is apparent that the oxide thickness increases with increasing dose. However, this is not necessarily inconsistent with the hypothesis, since the near-surface concentration of Ge increases with implantation doses as a result of the greater number of implanted ions and erosion of the surface by sputtering. Therefore, the "critical" amount of interfacial Ge needed for rate enhancement is piled-up progressively earlier during oxide growth as the implantation dose increases.

Oxide thicknesses were calculated for the various doses, using the step-function approximation to account for the effect of the Ge, in the following way. The reaction constants A and B were determined for 900° C. steam oxidation of nonimplanted Si to be A=0.706 um and B=0.165 m$^2$/h. This value of B and the oxide thickness at the highest implant dose of $5 \times 10^{16}$ cm$^{-2}$ were then used to determine a modified A=A', which was assumed constant over the entire oxidation cycle. According to the model, this is a good assumption since less than 5 nm of oxide growth is needed to pile-up a ML of Ge at the interface at this dose. From the calculation, A' was determined to be 0.014 um, which is reduced by a factor of 50 over the intrinsic value. The oxide thicknesses at the lower implant doses and for different oxidation times were then calculated by dividing the growth into two parts: one in which the intrinsic growth kinetics are applicable and one which the modified kinetics governs the growth.

The transition between these two regions is the oxide thickness for which 1 ML is piled-up. It can be seen in FIG. 4 that the calculated model thicknesses agree extremely well with the experimental data. Therefore, a single, modified interfacial reaction rate can be used to accurately reproduce the data, consistent with the mode which assumes no dependence on the thickness of the Ge layer (beyond 1 ML).

The influence of the Ge layer on the oxidation kinetics appears to be the result of the reduced binding energy of Si atoms at the oxide interface. The Si—Ge binding energy in the Ge film should be comparable to the Ge-Ge binding energy of 42 KCal/mole, which is lower than the Si-Si binding energy of 76 KCal/mole. Since the interface reaction is an activated process with an Arrhenius temperature dependence, it is expected that an order to magnitude estimate of the ratio A/A' should be given by $\exp[-(E/RT)]$ wherein R is the gas constant, T the oxidation temperature, and E, the difference in binding energy of a Si atom in Ge and in Si. This estimation gives 112 which is comparable in magnitude with the experimental value, 50. Therefore, the reduction in the binding is sufficient to account for the effect.

EXAMPLE 2

Single n-type Si(100) crystals with resistivities in the range of 1–15 ohm-cm were used as a substrate on which implantation was performed using singly charged $^{74}Ge^+$ ions with an average current density of 10 uamps over the implanted area. Oxidation was done in a tube furnace at 900° C. and 1000° C. in a steam or oxidizing ambient atmosphere. Oxide thicknesses in the range of 80–400 nm were grown on the implanted samples. Transmission electron microscopy (TEM) samples were prepared by a combination of mechanical polishing and $Ar^+$ ion-beam milling. Rutherford backscattering spectrometry (RBS) measurements were done using 2.0 MeV $He^+$ ions and a scattering angle of 145°.

Figure 5:
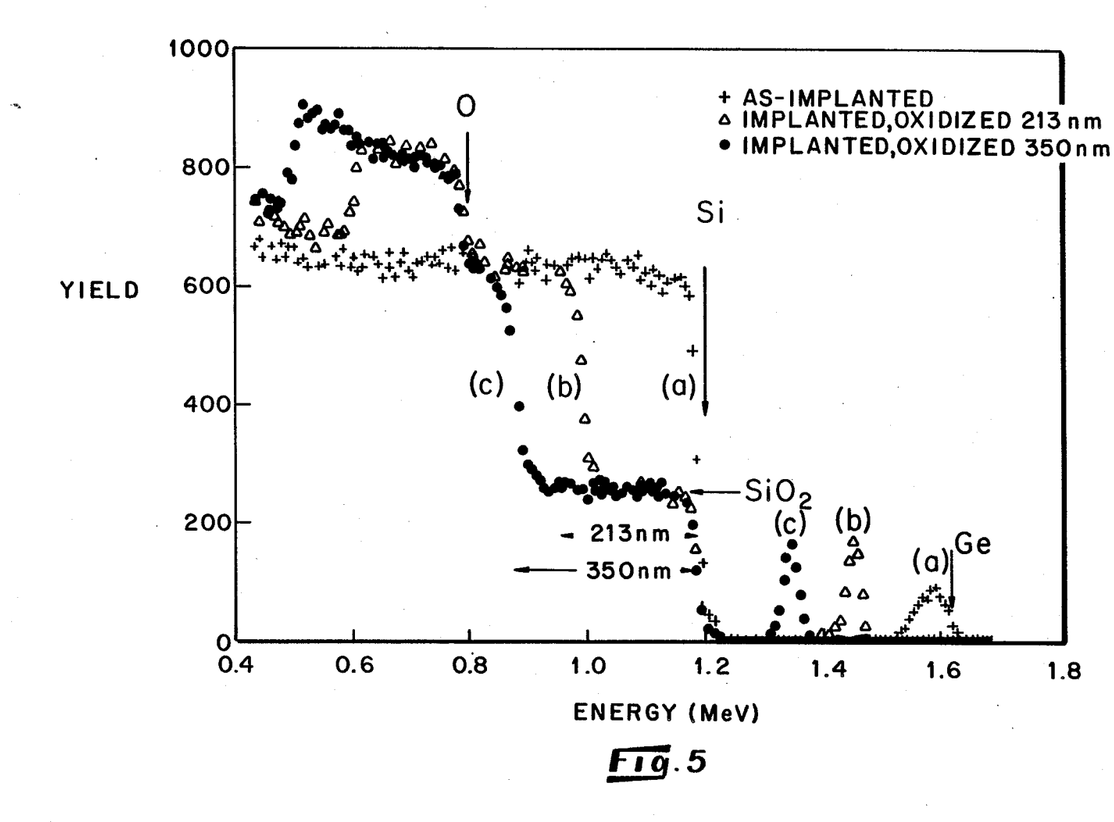
FIG. 5 is a graph of a comparison of 2 MeV, Rutherford backscattering random spectra of (a) (100) Si implanted by Ge (100 keV) to a dose of $10^{16}$ cm$^{-2}$, and (b) and (c) after steam oxidation in a tube furnace at 900° C. for 60 and 90 min., respectively. The pile-up of Ge at the interface and its transport deeper into Si by the SiO$_2$ front is shown.

FIG. 5 compares RBS spectra from samples, implanted with 100 keV $Ge^+$ ions at a fluence of $1\times10^{16}$ $cm^{-2}$, before and after oxidation. The position of the arrows for Si and Ge refers to the respective backscattering energy from these elements at the surface. In the as-implanted sample, the top 120 nm of the Si is caused to be amorphous, as measured from TEM results. The Ge ions are distributed within this layer in a Gaussian profile with a mean projected range of about 72 nm and straggle length of 25 nm. Since 0.46 nm of Si is consumed for every 1 nm of oxide grown, 90 nm of Si is oxidized in sample (b) during the growth of 213 nm $SiO_2$ shown in the figure. Therefore, the oxidation in this sample in such that it has consumed almost all of the Si is the region of the Ge implant.

Scattering from Ge in sample (b) occurs at lower energies than in sample (a) showing that the Ge has not been incorporated into the oxide during the growth but rather has been piled at the interface. Also, the distribution of the Ge has significantly narrowed from the original as-implanted profile, which is consistent with the formation of a uniform, thin layer of Ge. Since the thickness of this layer is less than the depth resolution of the RBS spectrometer, no distribution profile of the Ge could be determined. However, there is no evidence of Ge incorporation into the oxide and no tailing of Ge into the Si. A similar effect can be seen for sample (c) except that the greater oxide thickness has pushed the Ge deeper into the sample. Within the resolution of RBS, no germanium is lost during the drive-in.

Figure 6:
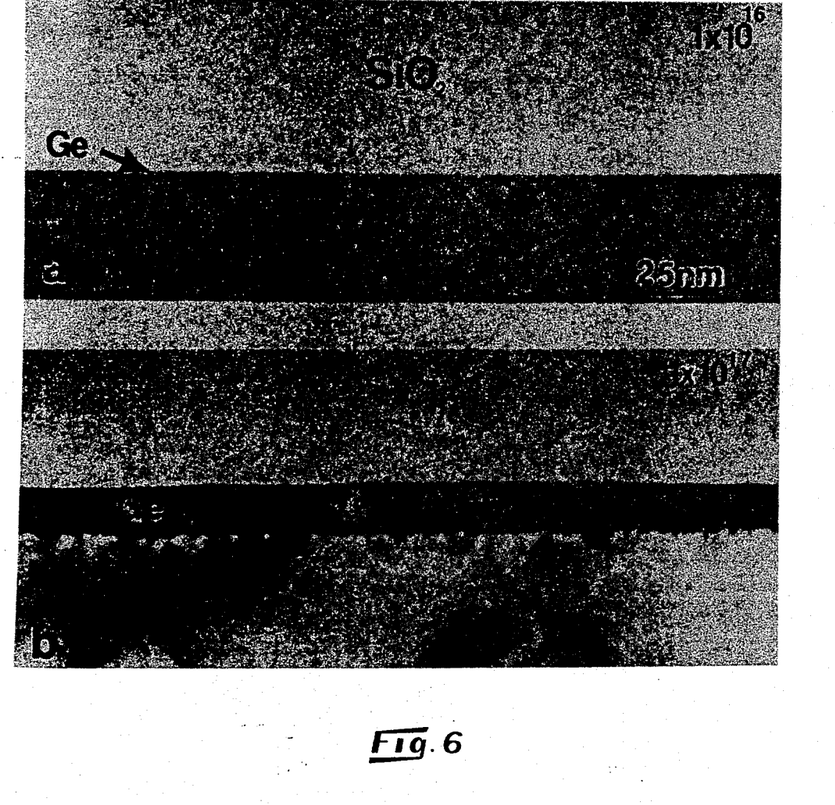
FIG. 6 is comprised of cross sectional micrographs of (a) $10^{16}$ cm$^{-2}$ and (b) $10^{17}$ cm$^{-2}$ Ge+ implants after oxidation showing complete pile-up of the Ge.

The TEM micrographs in FIG. 6 show the results of Ge pile-up after oxidation. In micrograph (a), an oxide thickness of 500 nm was grown on a sample which had been implanted with a dose of $1\times10^{16}$ $Ge/cm^2$. As shown, the layer is about 3.0 nm thick and very uniform across the sample. Micrograph (b) shows that for a higher implant dose ($1\times10^{17}$ $cm^{-2}$), the Ge layer is still uniform but has increased in thickness to >20 nm. A thickness of 300 nm of $SiO_2$ was grown on this sample, which was sufficient to pile-up the Ge but not to consume the dislocation band which forms near the end of range of implanted ions. Random and aligned spectra of this thicker layer shows that there is a concentration gradient of Si across the Ge layer with the layer containing about 18% Si at the Ge/Si interface and a much reduced concentration at the oxide interface. This gradient is consistent with bulk diffusion of Si through the Ge-rich layer which is necessary to supply Si to the Ge/$SiO_2$ interface during oxidation. Also, the minimum yield measured along <110> was 35%. This is an indication of an increased strain or defects within the thicker layer which is consistent with the results of molecular beam epitaxially (MBE) grown layers which show greatly increased minimum yields for thick epitaxial layers.

Figure 7:
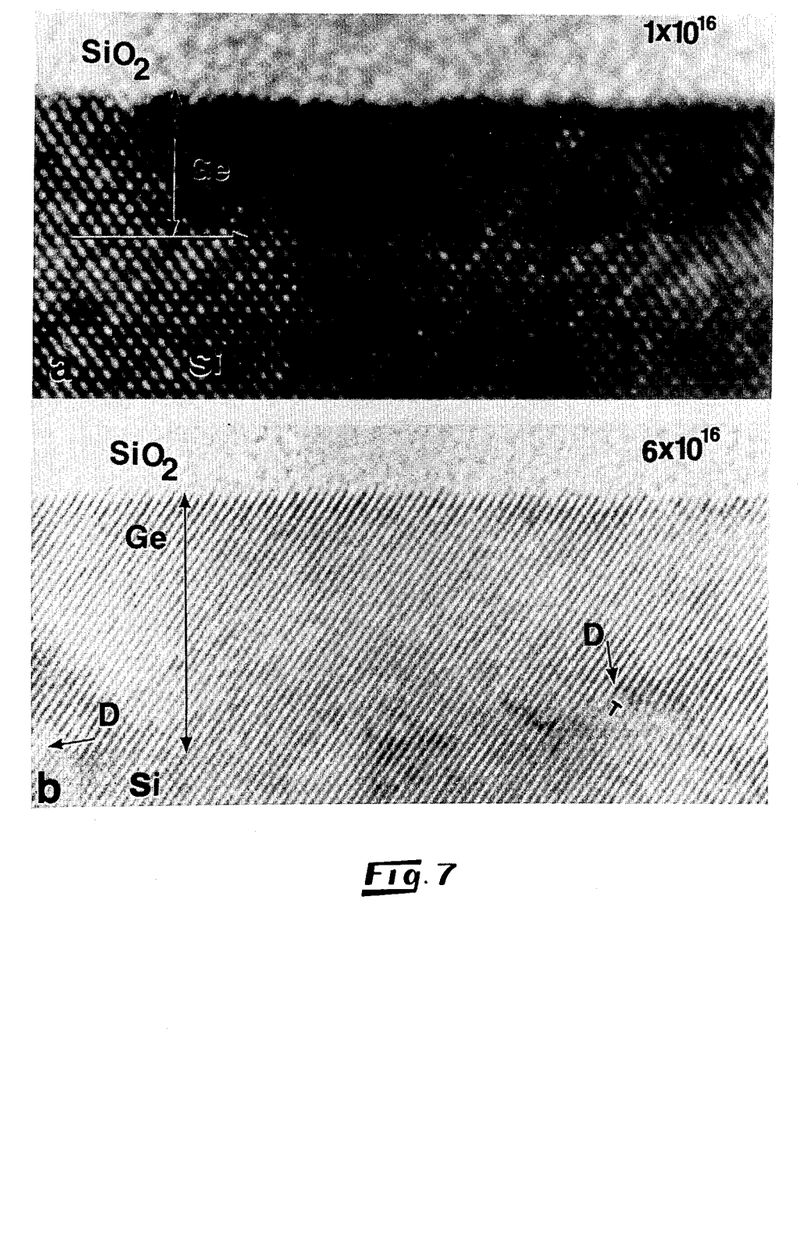
FIG. 7 is comprised of two high-resolution images of Ge layers resulting from the piling up of different Ge implant doses. The arrows on the micrographs show the extent and the orientation of the Ge layers. In micrograph (a) the Ge layer is epitaxial with no observable defects and forms a coherent interface with the Si substrate. In micrograph (b) misfit dislocations at the Ge/Si interface appear, indicated by the letter 'D'.

Micrographs in FIG. 7 compare high-resolution images of the Ge layers for three different Ge film thicknesses (i.e., implant doses). Micrograph (a) shows a thin layer of about 9 monolayers. The complete alignment of the [111]planes in going from Si to Ge shows that the film is epitaxial with a completely commensurate interface with Si. Also, its interface with $SiO_2$ is very planar with no measurable undulations as has been observed for Si/$SiO_2$ interfaces. For this thickness, no defects can be observed in the film or at the interfacial region with Si. However, in the high dose implants shown in micrograph (b), mismatch dislocations can be observed on the Si side of the interface as indicated on the figure. The number of dislocations is consistent with a mismatch of about 2% (1 mismatch every 50 lattice spacings). The layer is much less planar and more undulated at its bounding interfaces. No evidence of any intermediary layer between crystalline Ge and $SiO_2$ (such as $GeO_x$) can be seen in either of the micrographs 3(a) or 3(b). However, the behavior was not consistent for high-dose implantation. Depending on the implant conditions, it was observed that the film could become very nonuniform in thickness with large misoriented islands or precipitates of Ge at the interface and sometimes in the oxide. Graded energy implants such as in sample in micrograph (c) helped prevent this from occurring.

The formation of a distinct Ge layer has only been observed for steam oxidations and not for dry oxidation. This presumably is not due to any difference in the properties of the oxides grown by the two techniques or their interface with the Si, but rather to the kinetics associated with the different oxidation cycles. Steam oxidation is more rapid than dry $O_1$, with a linear rate constant of 2.5 nm/min compared to 0.3 nm/min for dry $O_2$. The increased growth velocity for steam oxidation v is sufficient that $vt >> (Dt)^{\frac{1}{2}}$, where D is $4.5\times10^{-18}$ $cm^2 s^{-1}$, the diffusion coefficient at 900° C. for Ge in Si, and t is the oxidation time. Hence, the oxidation rate in steam is fast enough to pile-up the Ge without any appreciable diffusion of Ge into the Si substrate.

As discussed above, the formation of a thermal Si oxide on Ge in accordance with the present invention offers several potential applications for integrated circuit fabrication. The greatly enhanced oxidation rates can reduce the total thermal budget in fabrication of IC's in Si. The subject process can be used anywhere in the fabrication process where $SiO_2$ is needed to be grown. Additionally, it has the advantage of offering unidirectional, enhanced growth. This may be useful in growing field oxides by local oxidation of silicon (LOCOS). The unidirectional nature of the enhancement will limit the lateral growth of oxide (known as bird's beaking) and reduce the area of the field isolation. Also, since the lattice constant of Ge is better matched than that of Si with $SiO_2$, strain-related effects associated with the oxide growth such as interfacial oxide roughness and point-defect generation are reduced. This potential reduction in point-defect generation should reduce or eliminate impurity diffusion, which occurs during prior art oxidation processes.

Ge advantageously does not electrically effect the Si. This technique can be used to mask regions using the differential growth rate of oxide between implanted and non-implanted Si. An example would be in forming the active regions in PMOS and NMOS transistors in a CMOS IC. During the p+ (usually boron) implant to form the source and drain regions of the PMOS transistors, the NMOS regions are masked by photolithography techniques. Ge could be implanted into the p+ regions before this mask is removed. Generally, another lithography step is needed to mask the p+ regions so that the n+ regions of the NMOS transistor can then be implanted (usually with As). In the present invention, a low temperature oxidation could be done after the first mask is removed which would grow more oxide over p+ regions (which have been implanted with Ge) than over nonimplanted n+ regions. The oxide over the p+ regions would serve as a mask against the n+ implant therefore eliminating the need for another photolithography step.

The Ge—Si heterostructures formed by the present invention have potentially useful optical and transport properties, and may have application as a substrate for epitaxial growth of GaAs to form optically coupled devices. Additionally, since the Ge layer is intermediate between the thermally-grown oxide and Si substrate, it offers the possibility of modifying the interfacial properties, such as charged state density and dopant distribution during oxidation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A process for enhancing the thermal oxidation rate of a selected surface portion of a silicon substrate, comprising the steps of:
   providing a substrate consisting essentially of a single crystal of silicon and having a surface portion to be oxidized;
   forming a surface epitaxial layer consisting essentially of germanium for providing a concentration of germanium in a near surface region in said silicon substrate at said surface portion to be oxidized sufficient to form at least one uniform monolayer of germanium coextensive with said surface portion to be oxidized during a subsequent heating step; and
   heating said substrate in an oxidizing atmosphere containing H$_2$O for effecting thermal oxidation of said surface portion and forming an essentially uniform epitaxial layer of germanium at least one monolayer in thickness at an interface between said substrate and a layer of silicon dioxide formed by said oxidation and with continuing heating of said substrate in said oxidizing atmosphere containing H$_2$O for providing enhanced growth rate of said silicon dioxide layer at said surface portion due to the presence of the underlying uniform layer of germanium.

2. The process as in claim 1 wherein said enhanced growth rate of said silicon dioxide layer is greater than that attainable on surface portions of said substrate devoid of said underlying layer of germanium.

3. The process as set forth in claim 2 wherein said heating step comprises heating said substrate at a temperature in the range of from about 700° to 1200° C.

4. The process as set forth in claim 3 wherein said forming step comprises implanting said surface region with germanium ions.

5. The process of claim 4 wherein said germanium ions are implanted with energies in the range of from about 50 to 160 keV at a fluence of at least $1 \times 10^{15}$ ions/cm$^2$ over the area of said surface to be oxidized.

6. The process as set forth in claim 5 wherein said heating step comprises heating said substrate in a steam atmosphere at a temperature of from about 900° to 1000° C.

7. A process for forming a uniform silicon dioxide layer on a silicon substrate, comprising the steps of:
   providing a substrate consisting essentially of a single crystal of silicon and having a surface portion to be oxidized;
   forming a surface epitaxial layer consisting essentially of germanium for providing a concentration of germanium in a near surface region in said silicon substrate at said surface portion to be oxidized sufficient to form at least one monolayer of germanium coextensive with said surface to be oxidized; and
   heating said substrate in an oxidizing atmosphere containing H$_2$O for a period sufficient to form a uniform layer consisting essentially of silicon dioxide and having a desired thickness on said surface portion of said substrate and an epitaxial layer of germanium at least one monolayer in thickness intermediate said silicon substrate and said silicon dioxide layer.

8. The process as set forth in claim 7 wherein said heating step comprises heating said substrate at a temperature in the range of from about 700° to 1200° C.

9. The process as set forth in claim 8 wherein said forming step comprises implanting said region with germanium ions.

10. The process of claim 9 wherein said germanium ions are implanted with energies in the range of from about 50 to 160 keV at a fluence of at least $1 \times 10^{15}$ ions/cm$^2$ over the area of said surface to be oxidized.

11. A process as set forth in claim 10 wherein the interface between said germanium layer and said silicon dioxide layer is essentially planar.

* * * * *